United States Patent
Hughes et al.

(10) Patent No.: US 11,329,634 B1
(45) Date of Patent: May 10, 2022

(54) DIGITAL FILTER STRUCTURE

(71) Applicant: Dialog Semiconductor B.V., s-Hertogenbosch (NL)

(72) Inventors: Ashley Hughes, Edinburgh (GB); Wessel Harm Lubberhuizen, Delden (NL); Johannes Steensma, Satellite Beach, FL (US)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 207 days.

(21) Appl. No.: 16/407,254

(22) Filed: May 9, 2019

(51) Int. Cl.
*H03H 17/02* (2006.01)
*G06F 1/10* (2006.01)

(52) U.S. Cl.
CPC .......... *H03H 17/0286* (2013.01); *G06F 1/10* (2013.01); *H03H 17/0292* (2013.01)

(58) Field of Classification Search
CPC ................................................ H03H 17/0292
See application file for complete search history.

(56) References Cited

U.S. PATENT DOCUMENTS

| | | |
|---|---|---|
| 3,793,513 A | 2/1974 | Kaneko |
| 5,262,972 A | 11/1993 | Holden et al. |
| 5,301,134 A | 4/1994 | Maruyama |
| 5,305,307 A | 4/1994 | Chu |
| 5,757,299 A | 5/1998 | Noro |
| 5,757,862 A | 5/1998 | Ishizu |
| 5,784,378 A * | 7/1998 | Murray ................. H03H 17/06 348/E7.008 |
| 5,805,479 A * | 9/1998 | Tang ..................... H03H 17/04 708/316 |
| 5,904,731 A * | 5/1999 | Matsui ............... H03H 17/0223 708/603 |

(Continued)

FOREIGN PATENT DOCUMENTS

| | | |
|---|---|---|
| EP | 2 860 874 | 12/2016 |
| GB | 2541977 | 3/2017 |
| WO | WO 2017/190976 | 11/2017 |

OTHER PUBLICATIONS

Notice of Allowance, U.S. Appl. No. 16/407,227, dated Apr. 20, 2020, First Named Inventor: Ashley Hughes, 10 pages.

(Continued)

*Primary Examiner* — Chuong D Ngo
(74) *Attorney, Agent, or Firm* — Saile Ackerman LLC; Stephen B. Ackerman

(57) ABSTRACT

A digital filter structure and related method of digital filtering are presented. The digital filter structure is arranged to receive one or more clocked input signals having a first clock rate, and which is driven at a second clock rate higher than said first clock rate. The digital filter structure has a plurality of delay elements and multiplexing circuitry arranged to selectively engage the delay elements such that, at every clock cycle of the digital filter structure, a filter operation is performed on a different stream of data. The disclosure can be applied in many different contexts. One particular implementation example is that of an adaptive noise cancellation (ANC) system using sigma-delta infinite impulse response filters. In this context the present disclosure minimizes latency and hardware implementation area by requiring only one filtering circuit for multiple channels of data to be filtered.

12 Claims, 8 Drawing Sheets

(56) References Cited

U.S. PATENT DOCUMENTS

| | | | |
|---|---|---|---|
| 5,946,650 | A | 8/1999 | Wei |
| 7,058,190 | B1 | 6/2006 | Zakarauskas |
| 7,636,747 | B2 | 12/2009 | Watanabe |
| 7,652,604 | B2 | 1/2010 | Parayandeh et al. |
| 7,696,913 | B2 | 4/2010 | Melanson |
| 7,756,222 | B2 | 7/2010 | Chen |
| 8,467,483 | B2 | 6/2013 | Vishakhadalla |
| 8,644,523 | B2 | 2/2014 | Clemow |
| 8,737,636 | B2 | 5/2014 | Park et al. |
| 8,896,738 | B2 | 11/2014 | Sato et al. |
| 9,053,697 | B2 | 6/2015 | Park et al. |
| 9,065,471 | B1 | 6/2015 | Okuda |
| 9,209,828 | B2 | 12/2015 | Schubert et al. |
| 9,361,872 | B2 | 6/2016 | Park et al. |
| 9,584,146 | B2 | 2/2017 | Op 't Eynde et al. |
| 9,644,561 | B2 | 5/2017 | Magner |
| 9,659,558 | B2 | 5/2017 | Park et al. |
| 9,857,921 | B2 | 1/2018 | Pant |
| 10,236,905 | B1 | 3/2019 | Callanan et al. |
| 2005/0008071 | A1 | 1/2005 | Bose et al. |
| 2005/0053227 | A1 | 3/2005 | Fortier |
| 2007/0188218 | A1 | 8/2007 | Ueda |
| 2007/0273446 | A1 | 11/2007 | Kim |
| 2007/0285160 | A1 | 12/2007 | Kim |
| 2008/0225168 | A1 | 9/2008 | Ouslis |
| 2008/0250093 | A1* | 10/2008 | Zhu ................ H03H 17/0292 |
| | | | 708/316 |
| 2010/0318205 | A1 | 12/2010 | Ohkuri |
| 2011/0007907 | A1 | 1/2011 | Park et al. |
| 2012/0148074 | A1 | 6/2012 | Bastiaens |
| 2014/0112492 | A1 | 4/2014 | Clemow |
| 2014/0125504 | A1 | 5/2014 | Braswell |
| 2014/0333462 | A1 | 11/2014 | Breems |
| 2016/0173112 | A1 | 6/2016 | Das |

OTHER PUBLICATIONS

US NOA, U.S. Appl. No. 16/854,341, First Named Inventor: Ashley Hughes, Mail date: Nov. 9, 2020, 19 pages.
D.A. Johns et al., "Sigma-delta based IIR filters," [1991] Proceedings of the 34th Midwest Symposium on Circuits and Systems, Monterey, CA, USA, May 1992, pp. 210-213, vol. 1.
D. A. Johns et al., "Design and analysis of delta-sigma based IIR filters," IEEE Transactions on Circuits and Systems II: Analog and Digital Signal, Processing, vol. 40, Issue: 4, Apr. 1993, pp. 233-240.
D. A. Johns et al., "IIR filtering on sigma-delta modulated signals," Electronics Letters, Feb. 14, 1991, vol. 27, No. 4, pp. 307-308.
D. A. Johns, "Analog and Digital State-Space Adaptive IIR Filters", PhD Thesis, Mar. 1989, 153 pages.
D. A. Johns et al., "Adaptive Recursive State-Space Filters Using a Gradient-Based Algorithm," IEEE Transactions on Circuits and Systems, vol. 37, Issue: 6, Jun. 1990, pp. 673-684.
P. W. Wong et al., "FIR Filters with Sigma-Delta Modulation Encoding," IEEE Transactions on Acoustics, Speech, and Signal Processing, vol. 38, Issue: 6, Jun. 1990, pp. 979-990.
Horst Gether et al., A perspective on digital ANC solutions in a low latency dominated world, EDN, Jun. 19, 2017, https://www.edn.com/design/analog/4458544/A-perspective-on-digital-ANC-solutions-in-a-low-latency-dominated-world.
M. A. Aldajani et al., "Stability analysis of an adaptive structure for sigma delta modulation," ICECS 2000. 7th IEEE International Conference on Electronics, Circuits and Systems (Cat. No.00EX445), Dec. 2000, pp. 129-132, vol. 1.
M. A. Aldajani et al., "Stability and Performance Analysis of an Adaptive Sigma-Delta Modulator," IEEE Transactions on Circuits and Systems II: Analog and Digital Signal Processing, vol. 48, No. 3, Mar. 2001, pp. 233-244.
Robert Bristow-Johnson, DSP Trick: Fixed-Point DC Blocking Filter With Noise-Shaping, dspGuru by Iowegian International, Apr. 17, 2011, https://dspguru.com/dsp/tricks/fixed-point-dc-blocking-filter-with-noise-shaping/, accessed on Apr. 18, 2019, 2 pages.
Richard G. Lyons, DSP Tricks: DC Removal, Embedded, Aug. 11, 2008, https://www.embedded.com/design/configurable-systems/4007653/DSP-Tricks-DC-Removal, accessed on Apr. 18, 2019, pp. 1-5.
Richard G. Lyons, Understanding digital signal processing, Second Edition, Prentice Hall PTR, 2004, chapter 13, pp. 84-87.
Ali Grami, Introduction to Digital Communications, Elsevier, 2016, chapter 5, pp. 217-264.
A query on the non-uniform Quantization, Stack Exchange, 2017, https://dsp.stackexchange.com/questions/40137/a-query-on-the-non-uniform-quantization, accessed on Apr. 18, 2019.
Jon Dattorro, The Implementation of Recursive Digital Filters for High-Fidelity Audio, Journal of Audio Engineering Society, Nov. 1988, vol. 36, No. 11, pp. 851-878 and Letters to the Editor.
Thomas Kite, Understanding PDM Digital Audio, Audio Precision Inc., 2012, http://users.ece.utexas.edu/~bevans/courses/rtdsp/lectures/10 Data Conversion/AP Understanding PDM Digital Audio.pdr, accessed on Apr. 18, 2019, pp. 1-9.
Xilinx, CIC, Aug. 2007, https://www.mit.bme.hu/systems/files/oktatas/targyak/8498/CIC_ppt.pdf, accessed in Apr. 18, 2019, 45 pages.
Alan V. Oppenheim et al., "Discrete-Time Signal Processing", 2010 Pearson, p. 412.
U.S. Office Action, U.S. Appl. No. 16/407,232, Applicant: Hughes et al., dated Jun. 9, 2020, 25 pages.
U.S. Notice of Allowance, U.S. Appl. No. 16/407,227, First Named Inventor: Ashley Hughes, dated Jun. 5, 2020, 11 pages.
U.S. Notice of Allowance, U.S. Appl. No. 16/407,250, First Named Inventor: Ashley Hughes, dated Jun. 2, 2020, 9 pages.
U.S. Notice of Allowance, U.S. Appl. No. 16/407,247, First Named Inventor: Ashley Hughes, dated Jun. 15, 2020, 9 pages.
U.S. Notice of Allowance, U.S. Appl. No. 16/407,242, First Named Inventor: Ashley Hughes, dated Jun. 2, 2020, 7 pages.
U.S. Notice of Allowance, U.S. Appl. No. 16/407,227, filed May 9, 2019, Applicant: Hughes et al., dated Jan. 21, 2020, 13 pages.
U.S. Notice of Allowance, U.S. Appl. No. 16/407,242, filed May 9, 2019, Applicant: Hughes et al., dated Jan. 8, 2020, 12 pages.
U.S. Notice of Allowance, U.S. Appl. No. 16/407,247, filed May 9, 2019, Applicant: Hughes et al., dated Jan. 17, 2020, 12 pages.
U.S. Office Action, U.S. Appl. No. 16/407,250, filed May 9, 2019, Applicant: Hughes et al., dated Feb. 4, 2020, 14 pages.

* cited by examiner

DIGITAL FILTER STRUCTURE

RELATED PATENT APPLICATIONS

This application is related to application Ser. No. 16/407,250, filed on May 9, 2019, application Ser. No. 16/407,247, filed on May 9, 2019, application Ser. No. 16/407,242, filed on May 9, 2019, application Ser. No. 16/407,232, filed on May 9, 2019 and application Ser. No. 16/407,227, filed on May 9, 2019, all of which are assigned to a common assignee, and all of which are incorporated by reference in their entirety.

TECHNICAL FIELD

The present disclosure relates to a digital filter structure, methods of digital filtering and in particular but not exclusively to audio signal processing structures and devices incorporating such structures.

BACKGROUND

A digital filter is a system providing hardware components that act to carry out desired operations on a sampled, discrete-time signal.

The physical area taken up by a digital filter increases if it is desired to implement multiple filter stages or to process multiple channels of incoming data, as filter structures must be repeated.

In addition to requiring more physical area on a circuit, increasingly complex digital filters can also have higher latency and higher power consumption. These issues are particularly acute in the field of consumer devices where silicon area is at a premium and there is great pressure to increase battery life and ensure responsive device performance.

SUMMARY

According to a first aspect of the disclosure there is provided a digital filter structure arranged to receive one or more clocked input signals having a first clock rate, and which is driven at a second clock rate higher than said first clock rate; said digital filter structure comprising a plurality of delay elements and multiplexing circuitry arranged to selectively engage the delay elements such that, at every clock cycle of said digital filter structure, a filter operation is performed on a different stream of data.

The digital filter structure may be provided as part of a system that includes a first filter clock for receiving and outputting digital signals, and a second filter clock that is used to drive the digital filter structure. The second filter clock may be part of the digital filter structure itself or may be provided as a separate component external to the digital filter structure.

Optionally, the digital filter structure further comprises an input multiplexer arranged to select between a plurality of input data channels.

Optionally, the digital filter structure further comprises a coefficient multiplexer arranged to select between a plurality of filter coefficients.

The digital filter structure may also comprise both an input multiplexer and a coefficient multiplexer.

Optionally, the coefficient multiplexer comprises a feedforward coefficient multiplexer arranged to select between a plurality of feedforward filter coefficients and a feedback coefficient multiplexer arranged to select between a plurality of feedback filter coefficients.

Optionally, the digital filter structure implements a linear time-invariant infinite impulse response digital filter.

Optionally, the received clocked input signals comprise pulse density modulated signals.

Optionally, the digital filter structure comprises a first memory for storing filter coefficients, a second memory structure comprising one or more registers and a coefficient loader arranged to fetch coefficients from said first memory and load them into said registers for use by the digital filter structure.

Optionally, the second memory structure comprises a bank of memory registers coupled in series in a shift register arrangement.

Optionally, the second memory structure comprises a plurality of register banks which operate in parallel.

According to a second aspect of the disclosure there is provided an audio signal processing structure arranged to receive one or more clocked input signals having a first clock rate, and which is driven at a second clock rate higher than said first clock rate; said audio signal processing structure comprising a plurality of delay elements and multiplexing circuitry arranged to selectively engage the delay elements such that, at every clock cycle of said audio signal processing structure, a filter operation is performed on a different stream of data.

According to a third aspect of the disclosure there is provided headphones comprising an audio signal processing structure, wherein the audio signal processing structure is arranged to receive one or more clocked input signals having a first clock rate, and which is driven at a second clock rate higher than said first clock rate; said audio signal processing structure comprising a plurality of delay elements and multiplexing circuitry arranged to selectively engage the delay elements such that, at every clock cycle of said audio signal processing structure, a filter operation is performed on a different stream of data.

Optionally, the audio signal processing structure is provided as part of an adaptive noise cancellation device.

According to a fourth aspect of the disclosure there is provided a method of digital filtering comprising: providing a digital filter structure arranged to receive one or more clocked input signals having a first clock rate, and which is driven at a second clock rate higher than said first clock rate; said digital filter structure comprising a plurality of delay elements and multiplexing circuitry arranged to selectively engage the delay elements such that, at every clock cycle of said digital filter structure, a filter operation is performed on a different stream of data.

The method of the fourth aspect may also incorporate using or providing features of the first aspect and various other steps as disclosed herein.

BRIEF DESCRIPTION OF THE DRAWINGS

The disclosure is described in further detail below by way of example and with reference to the accompanying drawings, in which.

DESCRIPTION

In signal processing, a modulator is a structure which acts to vary one or more properties of a varying periodic carrier signal with a modulating signal that may contain information to be transmitted.

Modulation techniques can be digital or analogue, depending on whether the carrier signal is modulated by a continuous or a quantized signal. Pulse density modulation schemes are an example of digital modulation techniques in which an analog carrier can be modulated by a discrete quantized signal.

An example of a pulse modulation scheme is sigma-delta modulation (SDM), which is also sometimes referred to as delta-sigma modulation. SDM is often used as a component part of analog-to-digital converters (ADC) to encode analog signals into digital signals, and also as a component part of digital-to-analog converters (DAC) to convert high bit-count, low-frequency digital signals into lower bit-count, higher-frequency digital signals.

Figure 1:
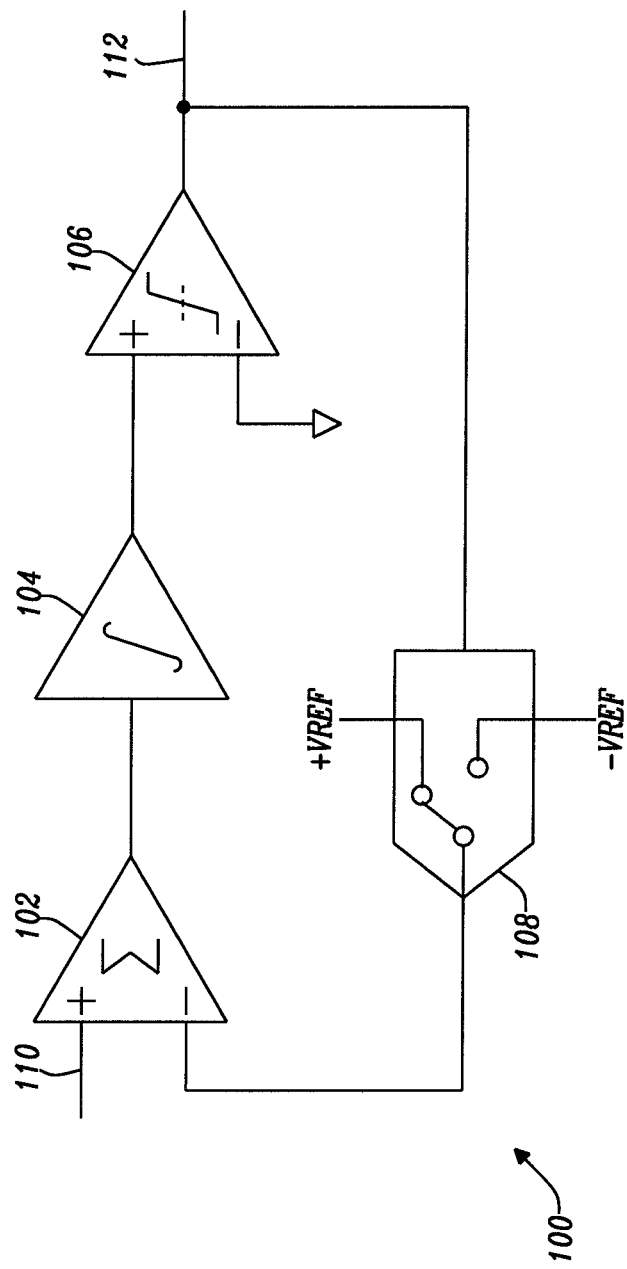
FIG. 1 shows a delta sigma modulator according to the prior art.

FIG. 1 shows a basic sigma-delta modulator structure 100, comprising a difference amplifier 102, an integrator 104, a comparator 106 and a one-bit DAC 108.

The one-bit DAC 108 operates to couple either a negative reference voltage −VREF or a positive reference voltage +VREF to an input of the difference amplifier 102. The difference amplifier 102 provides an output proportional to the difference between the input signal 110 and the reference voltage provided by the one-bit DAC 108. The integrator 104 integrates the difference between the input signal and the reference voltage as output by the difference amplifier 102. The comparator 106 then determines the next modulator output 112 based on the integrator 104 value compared with a threshold voltage applied at its inverting input, and provides a binary output that is in a high or a low state based on whether the integrator 104 value is respectively larger or smaller than the threshold voltage.

The one-bit DAC 108 produces an output corresponding to the positive reference voltage +VREF or negative reference voltage −VREF. If the modulator output 112 is a 1, the reference voltage is subtracted from the input 110. If the output 112 is a 0, the reference voltage is added to the input 110. At every modulator clock pulse, the modulator completes a full cycle and generates a new output.

The modulator 100 is typically operated via a modulator clock, which determines the sampling interval of the input 110. As the modulator clock continues to run, each modulator clock pulse will generate another modulator output pulse. The resulting output bit stream becomes a representation of the input voltage, proportional to the reference voltage.

A sigma-delta modulator relies on oversampling and noise shaping to achieve high resolution conversion. In digital signal processing, the Nyquist rate is the minimum sampling rate that is required for fidelity of signal reproduction. According to the Nyquist-Shannon sampling theorem, for a given sample rate fs, perfect reconstruction of a sampled signal is guaranteed for a limited frequency band B<fs/2. The threshold 2B is called the Nyquist rate and is an attribute of a continuous time input x(t) to be sampled.

A sigma-delta modulator samples a signal at a frequency fs which is much higher than the Nyquist rate. The ratio between the sampling rate fs and the Nyquist rate is usually referred to as oversampling ratio. By increasing the sampling rate, the available frequency band B is increased and the quantization noise introduced by the modulator is distributed over a larger spectrum in the frequency domain. Hence, oversampling reduces noise in the frequency band of interest.

Additionally, the noise transfer function of sigma delta modulators is such that noise is also reduced at low frequencies (where the signal of interest is) and increased at higher frequencies, where it can be filtered. Hence sigma delta modulators have optimal behaviour for noise shaping and are widely used in signal processing applications where it is desirable to have improved noise features in a low band of the frequency spectrum, such as in processing of digital audio signals.

Digital filters are used to process discrete time signals x(n), and hence are usually described in the frequency domain using Z-transforms. A useful property of the Z-transform is the delay property, according to which the Z-transform of a delayed sequence y[n]=x[n−k] is given by $Y[z]=Z^{-k}X[z]$. Accordingly, unit delay elements are often represented in diagrams of digital filters with a $Z^{-1}$ symbol. This notation will be hereinafter adopted in the diagrams of the accompanying drawings.

A digital filter can be characterised by its transfer function, which is the Z-transform of the filter response to an impulse. For a linear time-invariant filter the transfer function fully defines how the filter responds to any given input. The transfer function of a generic linear time-invariant filter can be written as (equation 1):

$$H[z] = \frac{\sum_{k=0}^{m} b[k] \cdot z^{-k}}{1 + \sum_{k=1}^{n} a[k] \cdot z^{-k}}$$

where a[k] are feedback coefficients, b[k] are feedforward coefficients, k, m and n are integers and z is a complex variable. The transfer function H[z] determines how the various frequency components of the input signals are reshaped by the filter. Given a circuit that implements a digital filter, it is possible to vary the filter response by varying its coefficients.

An infinite impulse response (IIR) filter is characterised by the fact that its impulse response does not go to zero after a finite time. In contrast, a finite impulse response (FIR) filter has an impulse response of finite duration. For an FIR filter the above transfer function would have all feedback coefficients equal to 0 and stability is always guaranteed as the transfer function has no poles, whereas for a IIR filter special care must be taken when designing the filter in order to ensure stability.

The order of a filter is defined by the greater of the values of m and n in equation 1 above, that is, as the maximum delay in input or output samples used to create each output sample. In a physically realised IIR, the filter order will be equal to the number of delay elements in the filter, while for a physically realised FIR, the filter order will be equal to the number of input taps (coefficient-delay pairs) in the filter structure.

The required filter order will depend on the desired transition band. IIR-based implementations require lower-order filters compared to FIR-based implementations of the same performance. Hence, implementations based on IIR filters generally require less computational power than implementations based on FIR filters.

Figure 2:
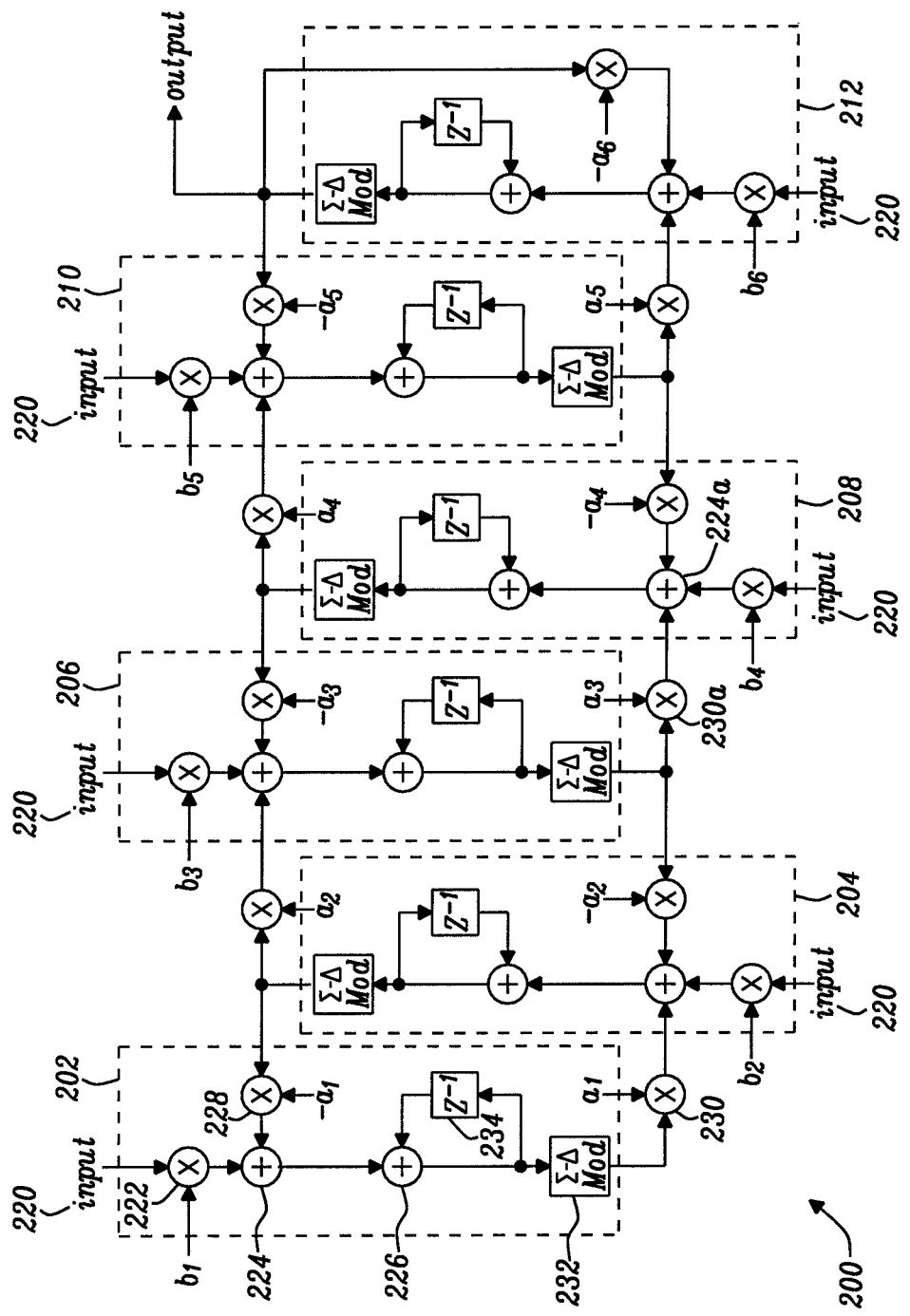
FIG. 2 shows a schematic of an infinite impulse response filter according to the prior art.

To implement higher order filter structures, a set of first order filter stages are coupled, with the output of one stage being provided as an input for a later stage. FIG. 2 shows a delta-sigma IIR filter structure 200, being in this example a sixth order filter using a transposed (input summing) quasi-orthonormal structure as described in Adaptive Recursive State-Space Filters Using a Gradient-Based Algorithm by johns et al, IEEE Transactions on Circuits and Systems, Vol. 37, No. 6, June 1990, herein incorporated by reference.

The sixth-order structure 200 comprises a plurality of filters 202, 204, 206, 208, 210, 212 which each receive an input signal 220, a feedforward coefficient $b_k$ and a feedback coefficient $a_k$, with k={1, 2, 3, 4, 5, 6}. Each of the filters 202-212 implements an IIR filter that is configured to provide at the output a sigma delta modulated signal. Each filter 202-212 comprises identical components but filters 204, 208 and 212 are vertically flipped with respect to filters 202, 206 and 210 to facilitate a compact layout.

Each filter 204-210 is coupled to a preceding (upstream) and a following (downstream) filter. For example, filter 206 is coupled to a preceding filter 204 and to a following filter 208. The first and last filters in the chain, 202, 212 are only coupled to respective following and preceding filters.

Each filter 202-212 comprises a first multiplier 222, a first adder 224, a second adder 226, a second multiplier 228, a unit delay element 234, and a sigma delta modulator 232. The first multiplier 222, the first adder 224, the second adder 226 and the sigma delta modulator 232 are connected in series within each filter. The unit delay element 234 is placed on a feedback loop between the output of the second adder 226 and the input of the second adder 226. If an incoming signal is a one-bit signal the multipliers can be efficiently realised as a 2-input multiplexor with the input signal acting as a control input selecting either positive or negative outputs.

In each filter 202-212, the input signal 220 is fed into the first multiplier 222 and the output signal of the filter is taken at the output of the sigma delta modulator 232. The first multiplier 222 also receives the feedforward coefficient $b_k$ and multiplies the input signal by the feedforward coefficient.

The second multiplier 228 of each filter except for filter 212 is connected to the output of the following filter and to the input of the first adder 224 of the filter in question. In filter 212, the second multiplier is connected to the output of filter 212 itself and to the input of the first adder of the filter 212.

The output of each filter 202-10 is coupled to an output multiplier 230 which multiplies the filter's output by the feedback coefficient ($a_k$) and feeds it into the following filter at the first adder 224. For example, the output of filter 206 is multiplied by feedback coefficient $a_3$ by output multiplier 230a and fed into the first adder 224a of filter 208. The output of each filter 204-212 is fed into the second multiplier 228 of the preceding filter to be multiplied by the negated feedback coefficient of that filter.

Separate filter circuitry is required for each order of the filter to be implemented. Furthermore, the structure 200 of FIG. 2 is for processing one channel of data, being input to each of the filters 202-212. If it is desired to process multiple channels, then each channel must be provided with its own filter structure, so the structure 200 of FIG. 2 would have to be repeated for each channel to be processed. Multiple channels are often required. For example, in an audio processing context, headphones can require feedforward and feedback channels for both left and right ears, for a total of four channels to be processed in parallel.

The requirement for multiple instantiations of filter structures for implementing a plurality of filter orders and/or for processing multiple channels, adds significant hardware area and can increase latency and power consumption.

The present disclosure provides an improved digital filter structure that exploits redundancy in the design of multiple filter stages used for implementing multiple filter orders and/or processing multiple channels of data. A filter structure according to the disclosure provides hardware which can be clocked at a relatively high frequency to be reused for different orders and/or channels thus making a substantial saving in surface area required for implementation of filters.

As seen in the example structure of FIG. 2, an existing single digital filter structure will comprise a number of filter processing elements which multiply or add incoming signals, a delay element and a modulator, here a sigma-delta modulator. According to the disclosure, a single digital filter structure can be provided, but which has instead of a single delay element a plurality of chained delay elements which are multiplexed so that they can operate with a different set of delays together with a single set of processing elements and a single modulator. This structure can be re-used to provide different filter orders and/or different filter channels. In preferred aspects, the new single digital filter operates at increased clock rate compared with an existing single digital filter structure, and compared with a clock rate of an incoming digital signal which provides an input for the new digital filter structure.

Figure 3:
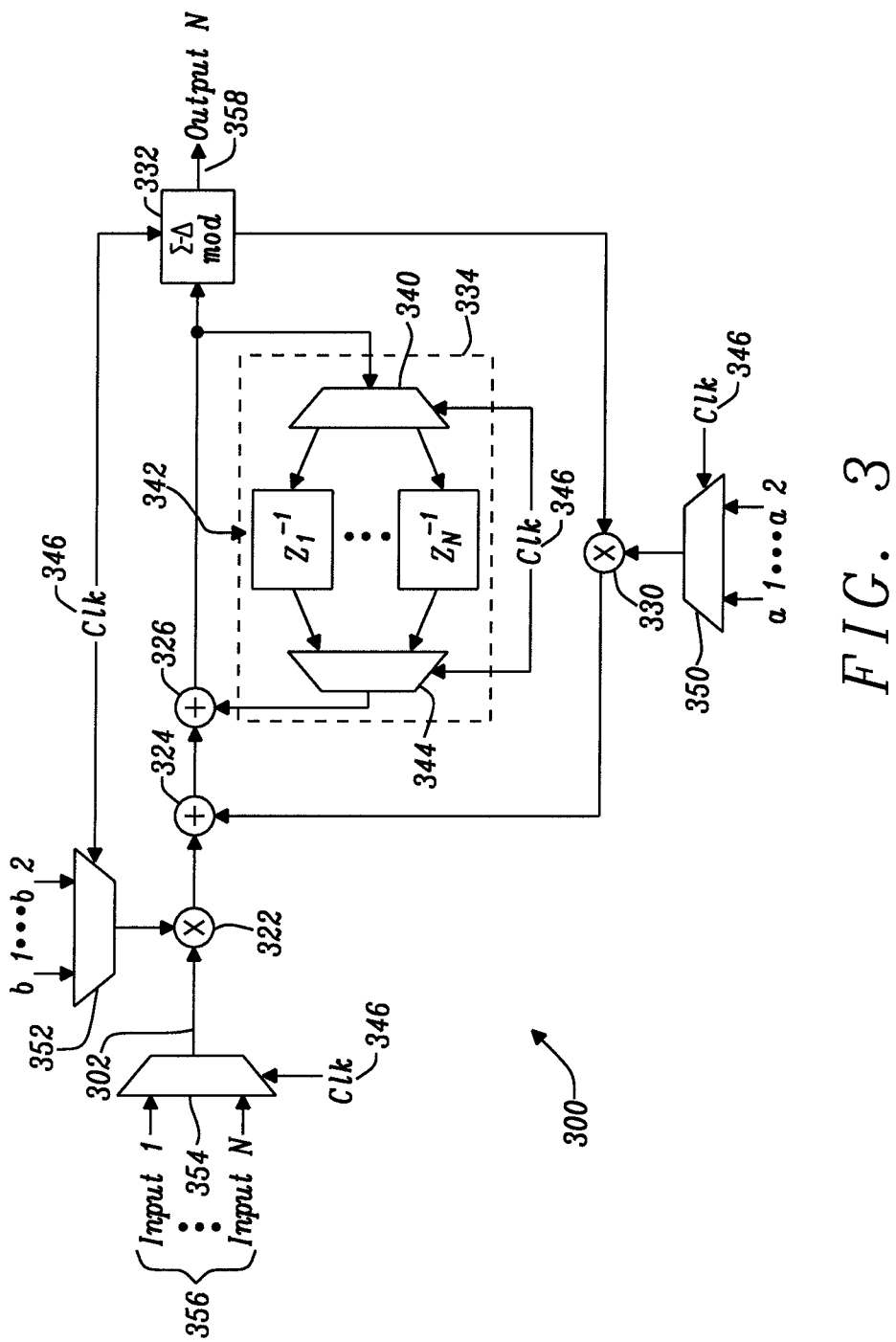
FIG. 3 is a schematic of a digital filter structure according to the present disclosure.

FIG. 3 shows an implementation of a reusable filter structure 300 according to one exemplary embodiment of the disclosure. In this illustrative example, the filter structure 300 is also an IIR filter and can be provided in place of the plurality of filter structures 202-212 such as those which are shown in FIG. 2.

In a similar manner to that shown in FIG. 2, the structure 300 has a multiplier 322 receiving an input 302, a first adder 324 and a second adder 326, a modulator 332, a multiplier 330 combining outputs from the modulator 332 with the feedback coefficients $a_k$, and a delay feedback loop. However, here the delay feedback loop comprises a delay network 334 rather than a single delay block 234.

The delay network 334 comprises a demultiplexer 340, a plurality of unit delay elements 342 and a multiplexer 344. The demultiplexer 340 receives the output of the second adder 326. This output is a combination of all previous input/output according to the order of the filter that this structure is implementing. In various embodiments at each cycle of the structure's clock 346 it could be a sample from a different channel or the same channel at different delay stages.

The demultiplexer 340 sends its received input to one of the delay elements 342 based on a clock signal 346. Each of the delay elements are unit-delay elements. An N-clock delay is achievable by an input sample x[n] if it travels in and out the filter structure 300 N times.

The selected delay element 342 then selected by a multiplexer 344 which provides an input for the adder 326.

The operation of the structure 300 is controlled according to a clock 346. This clock 346 is operated with a higher clock rate than that of the incoming data input 302, and will in preferred embodiments be greater by a factor of an integer multiple of the clock rate of the incoming data input 302, where the integer multiple corresponds to the level of redundancy that is required by the system.

The structure 300 may optionally include a capability to multiplex between different inputs, so that filter operations for different channels can be carried out for each cycle of the clock 346. To show how this is implemented for the example of an IIR filter, the structure 300 is shown with an optional input multiplexer 354 that selects between different inputs 356, input 1 through input N, based on the clock 346.

The structure 300 may optionally include a capability to multiplex between different filter coefficients, so that filter operations with specific selected filter coefficients can be carried out for each cycle of the clock 346. To show how this is implemented for the example of an IIR filter, the structure 300 is shown with an optional coefficient multiplexer system. Because this example is an IIR filter, the coefficient multiplexer system comprises a first feedback coefficient multiplexer 350 which can be used to select between different coefficients a1 . . . aN and a feedforward coefficients multiplexer 352 which can be used to select between different coefficients b1 . . . bN. In the case of an FIR filter, there would be no feedback coefficient multiplexer 350 as there are no feedback coefficients.

For example, the structure 300 might be used to implement a first order IIR filter for processing four parallel inputs 356 representing different channels and wherein each input is a sigma-delta modulated signal sampled at an incoming data rate fs and each input is to be processed with different filter coefficients. In this specific embodiment the clock 346 would have a clock rate of 4*fs in order to implement a first order filter. If a higher order filter was required, the clock rate could be increased to 4*n*fs where n is the required filter order; or alternatively the first order structure can be repeated n times—each of the filter orders is still able to process four channels in parallel to save hardware area compared with standard structures.

This specific embodiment has a 4-to-1 input multiplexer 354 for selecting the input channel, a 4-to-1 feedforward coefficient multiplexer 352 and a 4-to-1 feedback coefficient multiplexer 350 for selecting at each clock 346 cycle the correct feedforward and feedback coefficient $b_k$ and $a_k$ from a plurality of four feedforward coefficient $b_k$ and from a plurality of four feedback coefficients $a_k$ respectively. In this specific embodiment the delay network 334 comprises a 1-to-4 demultiplexer 340 and a 4-to-1 multiplexer 344 and the plurality of unit delay elements comprises four unit delay elements 342. At each clock, the clock signal 346 determines which delay element 342 the sample output by the adder 326 is written into and from which delay element 342 the sample input to the adder 324 is read from.

The disclosure also provides for several optional improvements which can facilitate meeting improved digital timing, area and power usage requirements for the higher clocking rate of the structure 300.

In order to reduce the area and therefore meet the digital area requirements of the filter in hardware, the processing of the structure may optionally be re-ordered to remove some registers. In FIG. 3, the outputs of the SDMs are implicitly registered to break the cyclical structure of the circuit and provide sampled output. Optionally, this can be skipped if the pipeline is configured such that the first operation is to calculate the SDM outputs. The SDMs would have to operate on pre-calculated inputs from the previous PDM input samples, however, as can be seen from FIG. 3, these values are already stored by the delay elements in the accumulators used by the filter structure itself. Thus, no additional circuitry is required to perform this re-ordering and as a result, the SDM outputs can be used directly to calculate the next states of the accumulators without being registered, meaning the implicit registers are no longer required.

Figure 4:
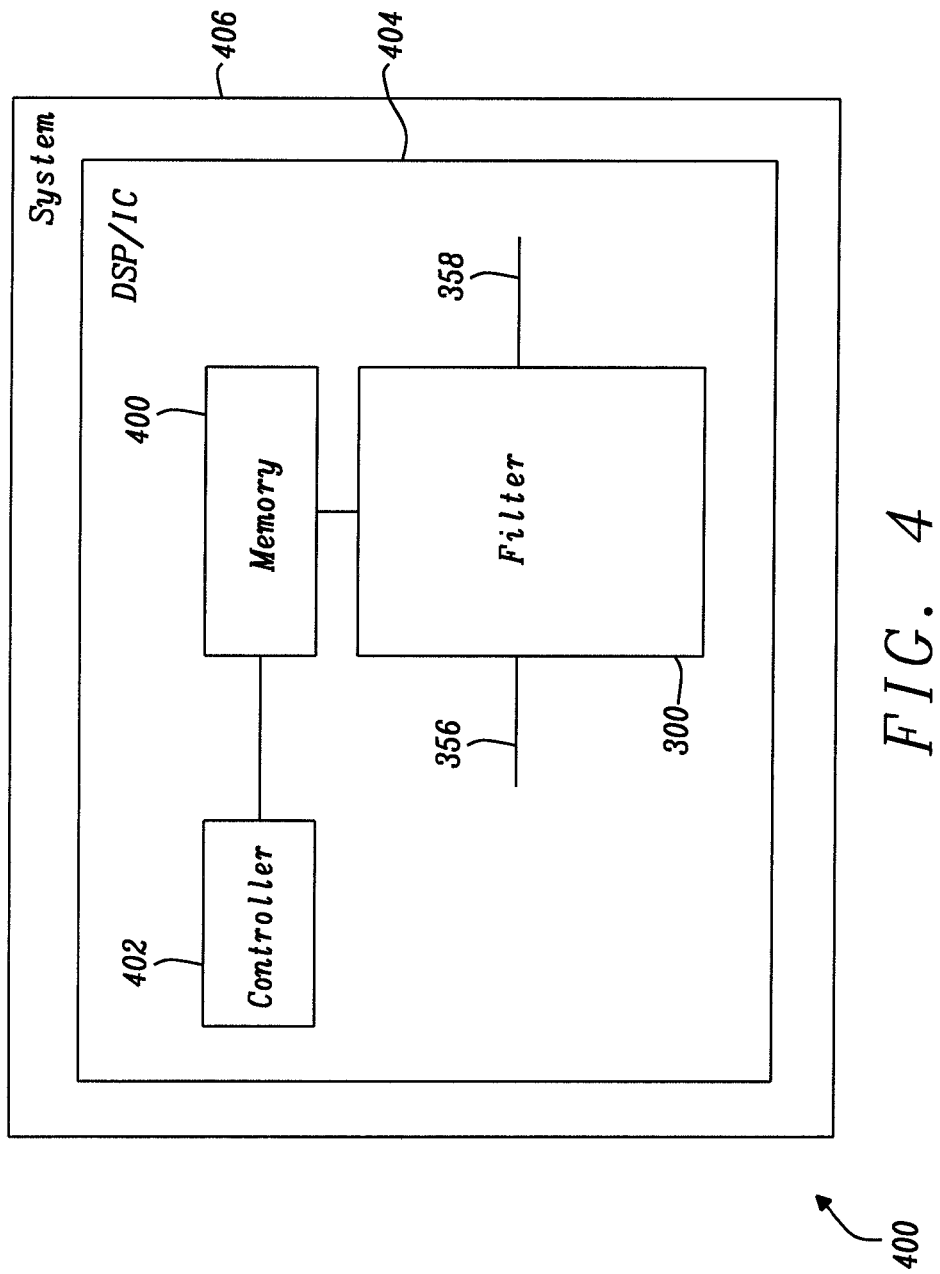
FIG. 4 illustrates a system including the digital filter structure of FIG. 3.

FIG. 4 shows the filter 300 in the context of a wider system. The coefficients for the filter are stored in a memory 400 and its operation is under the control of a controller 402 that may comprise an arithmetic logic unit or other microprocessor. These components may be provided as part of a wider integrated circuit 404 such as a digital signal processor (DSP). This may, in turn, be provided as part of a wider system 406 which could include other electronic components provided as part of an electronic consumer or commercial device.

In a prior art structure such as that shown in FIG. 2, all coefficients must be stored in a memory 400. An implementation of a filter such as the filter 300 shown in FIG. 3 with programmable coefficients will require some memory area for a user to store coefficients in. It is possible using standard memory that latency of a filtering operation could be impacted by the need to load coefficients from the memory. As both the feedforward and feedback coefficients for all filter stages are required for processing in parallel, requesting each coefficient in turn from the memory 400 would incur a latency cost of at least as many cycles as there are coefficients.

Additionally, when multiple channels are being processed by the same hardware, more coefficients would have to be loaded from the memory 400 increasing the performance requirements of the memory module used.

According to further aspects of the disclosure, a dedicated coefficient loader 504 is provided according to which all user programmed coefficients can be preloaded into dedicated registers 506 such that they are all available without having to be loaded from memory on every cycle.

The use of shift registers for sequencing the bits of the coefficients so that they are in place for the phase of each channel, operating together with the delay network 334 of multiple z-domain delay cells means that a single arithmetic processing unit can be used for each channel of a processor.

Figure 5:
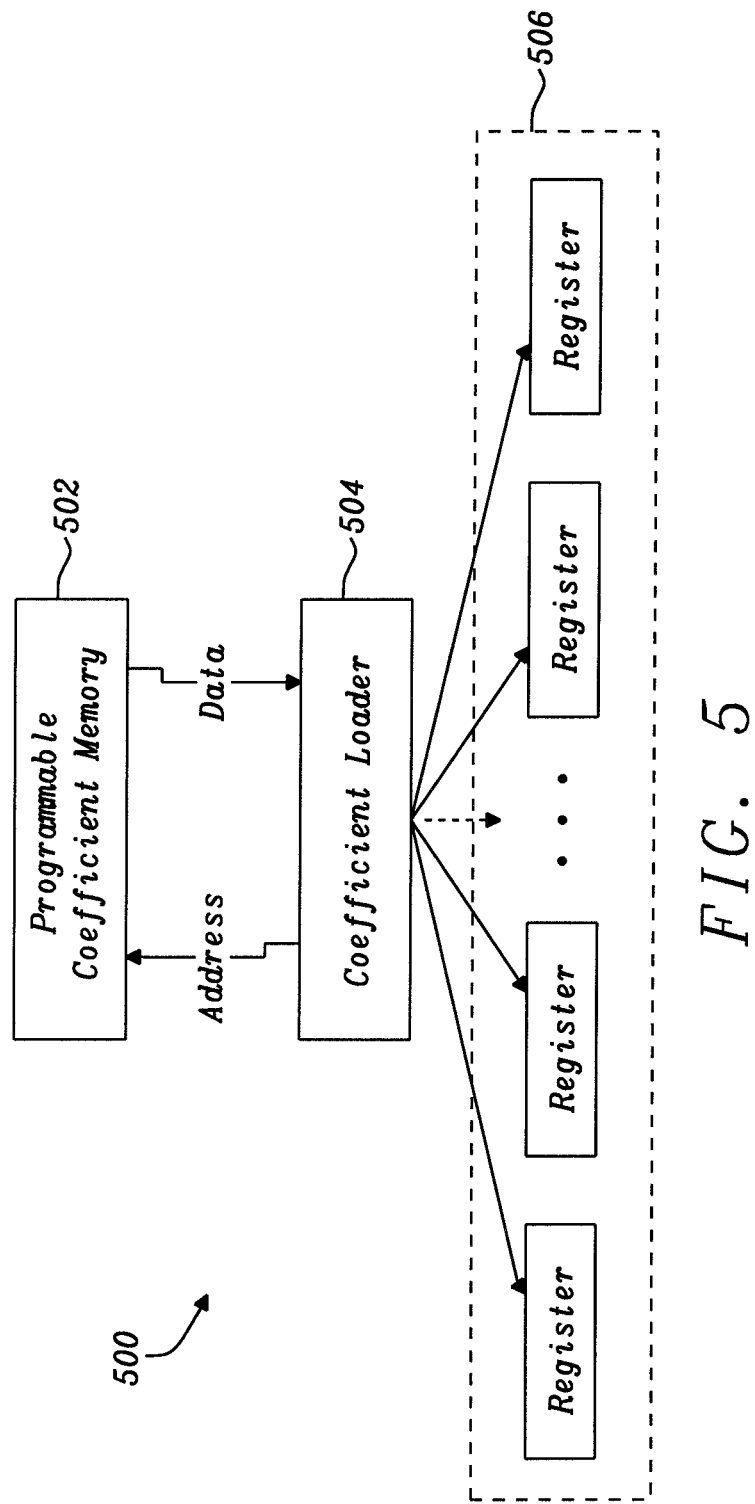
FIG. 5 illustrates a memory structure for use with a digital filter according to this disclosure.

FIG. 5 shows an example implementation of a memory structure 500 which could replace the memory 400 in the diagram of FIG. 4 and illustrates one example embodiment of a coefficient loader memory structure according to the disclosure.

Here, data from a programmable main coefficient memory 502 is retrieved by a coefficient loader 504 which, in this embodiment, may be a state machine, looping through all addresses in the memory 502 containing coefficients and then assigning those coefficients to appropriate registers 506. The main memory 502 is a random-access memory, or alternatively a non-volatile memory, and is relatively slow to access since a data must be retrieved via an addressing scheme, whereas a register 506 is a memory structure designed to hold data for immediate processing. Therefore, the idea of the coefficient loader 504 is to pre-prepare the coefficients in appropriate registers 506 so that they can be efficiently processed by a filter structure 300 without having to be loaded from the main memory 502/400 at each cycle.

The loading of the coefficients may be triggered whenever the system 300 is reset, and then subsequent processing cycles will not need to load coefficients directly from the memory.

When the filtering structure 300 is being used to process a plurality of channels, coefficients for every channel must be loaded into dedicated registers 506 and the correct coefficient chosen at each stage for every cycle by a multiplexer making its selection based upon the channel being processed in that cycle.

Even with this improvement there can still be potential problems with fanout from a memory component. For an mth order filter there are two m filter coefficients required and if in addition it is required to process n channels then a total of 2 mn registers are required. A state machine directing memory loads into registers would require a lot of wiring between the memory data outputs and the different register destinations.

One possible solution to this, according to an embodiment of the disclosure, is to provide an additional temporary register to reduce fanout from the memory component where coefficients are programmed to, but that register output still requires a lot of routing to other registers.

Figure 6:
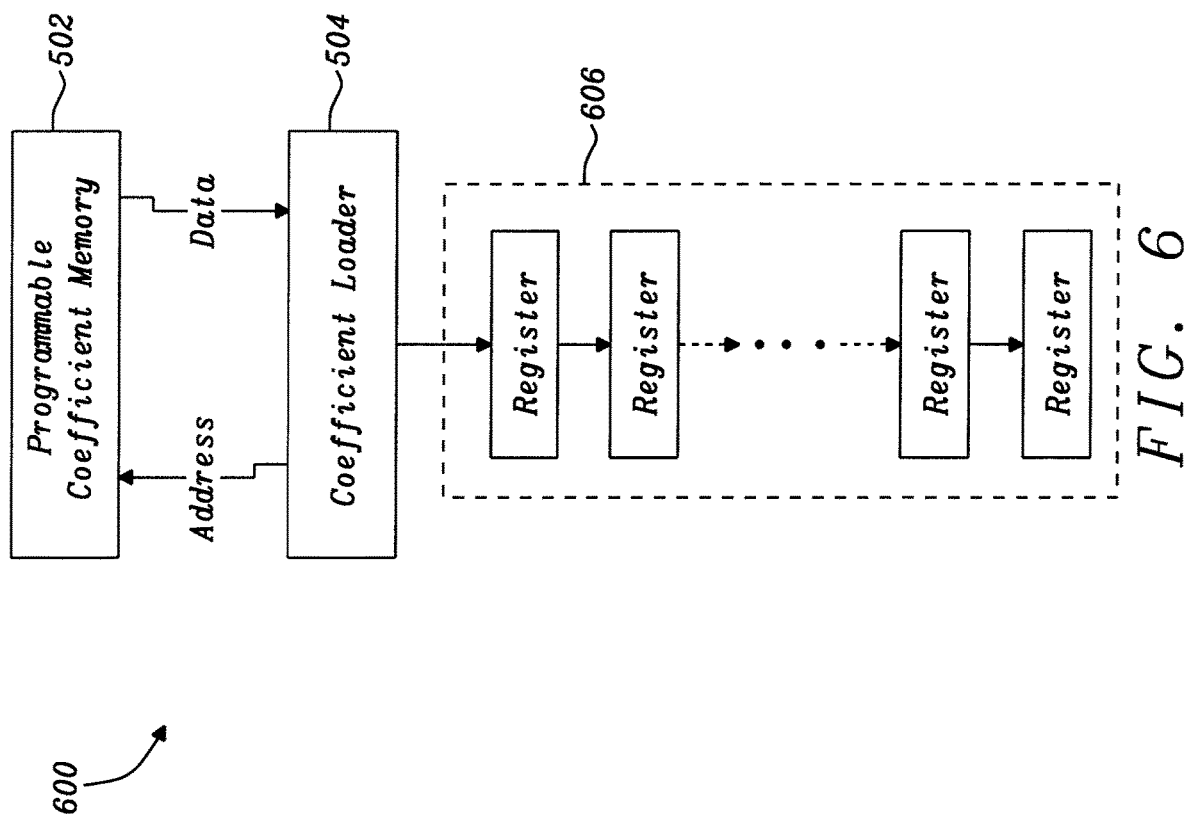
FIG. 6 illustrates an alternative memory structure according to a further embodiment.

FIG. 6 shows an alternative memory structure 600 designed to reduce memory fanout. According to this embodiment, a plurality of registers 606 are implemented as a shift register bank for the coefficient loading stage.

The registers 606 are coupled in series and operate together as a composite shift register. This reduces routing required from memory 502 to a single transfer to the first register 506 in the bank. Subsequent loads from memory 502 facilitated by the coefficient loader 504 are placed into the first register 506 in the bank and at the same time previously loaded values are shifted down the bank moving towards their final position. After the initial loading operation, the registers 506 are then used as normal registers which can be accessed simultaneously by the multiplexers of structure 300.

In some embodiments, the word size of the filter coefficients is small (for example, 16 bits). As a further modification, the system can be modified to take advantage of the relatively limited word size of the filter coefficients and load two or more coefficients at the same time if the memory module data bus width is large enough in relation to the coefficient word length.

Figure 7:
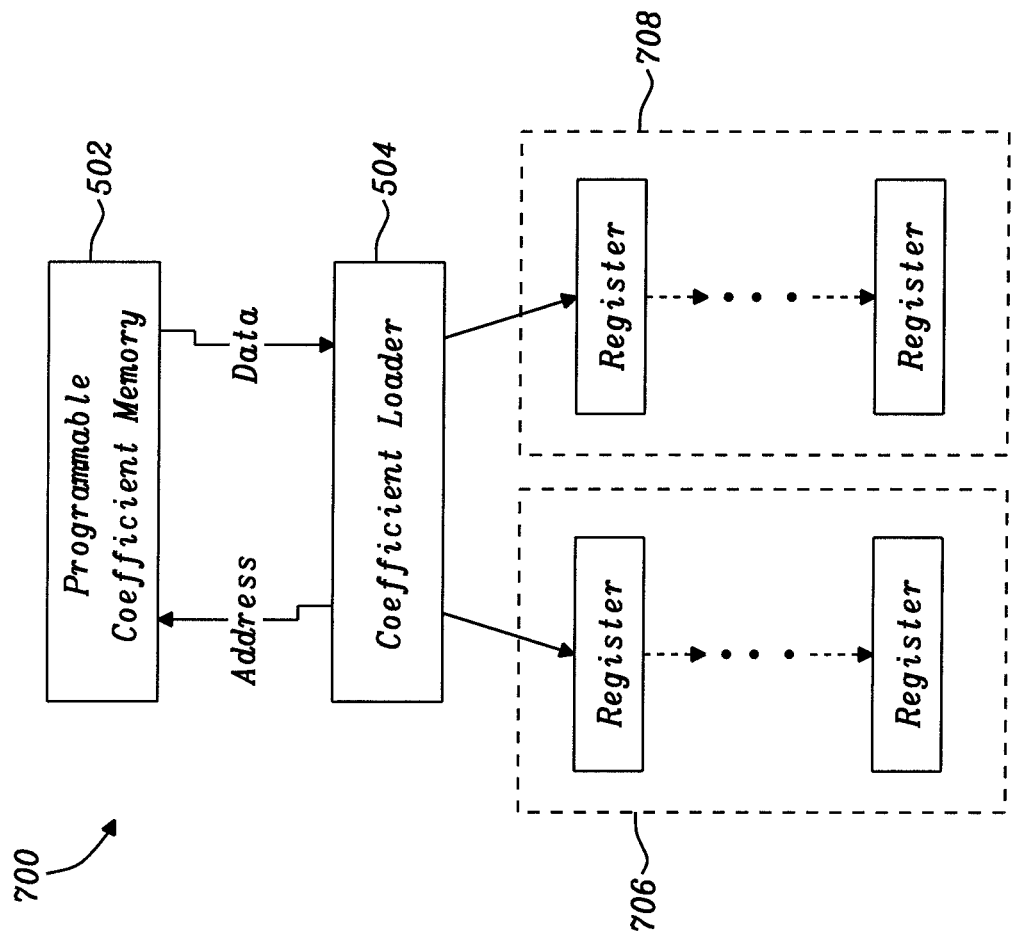
FIG. 7 illustrates an alternative memory structure according to a still further embodiment.
Figure 8:
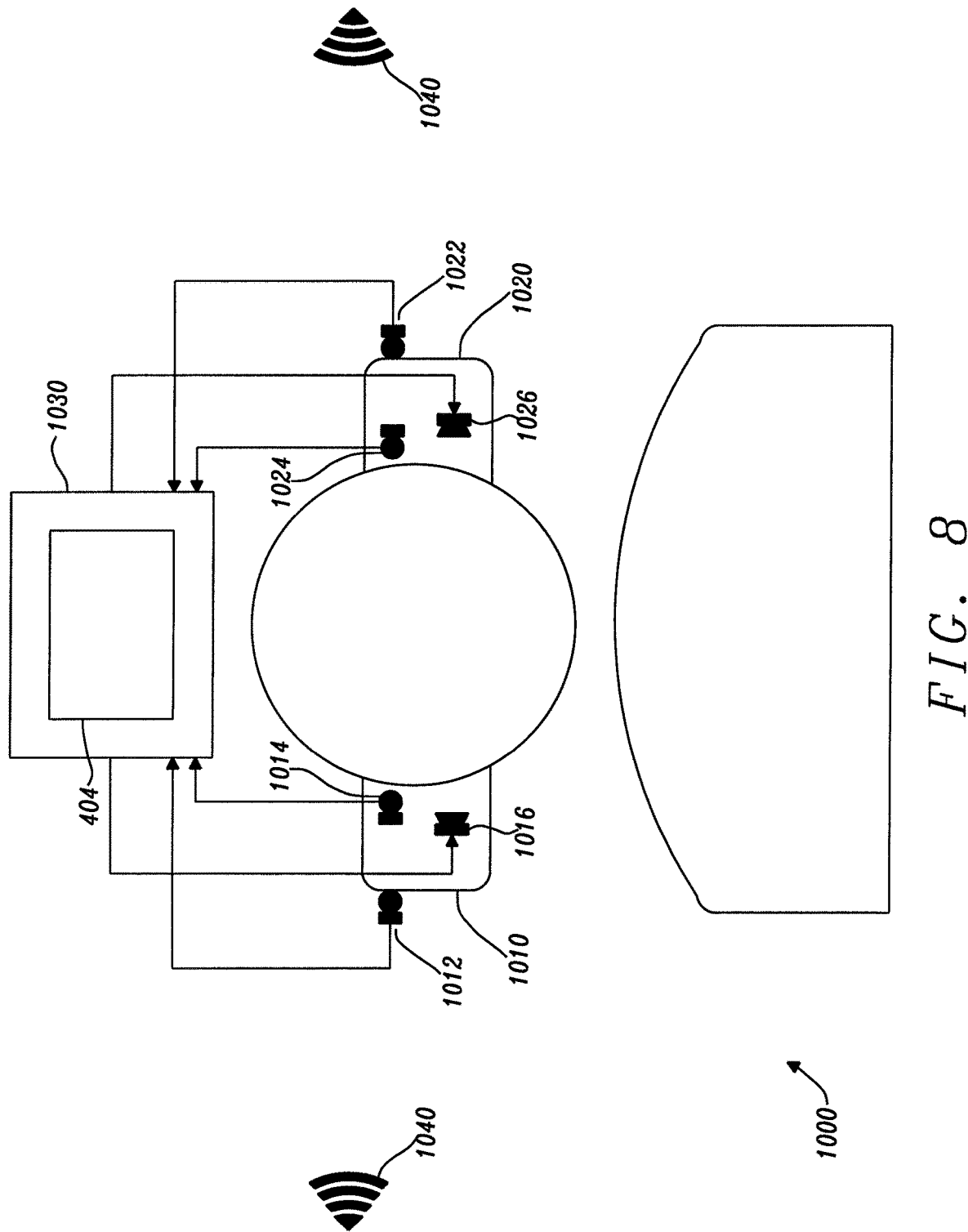
FIG. 8 illustrates a headphone apparatus including a digital filter according to the disclosure.

FIG. 7 shows an alternative memory loading structure 700 that, according to this principle, converts serial access to coefficients in memory to simultaneously accessible dedicated registers via multiple shift registers. The coefficient loading block 504 can load multiple packed coefficients from memory 502 in one load operation and then unpack and send these coefficients to separate shift registers being arranged in a first bank 706 and a second bank 708.

One example split which can be extended for different filter orders is to have the feedforward and feedback coefficients packed together in the same memory address and loaded into separate shift register banks 706 708, as illustrated.

Accordingly, it will be appreciated that various embodiments of this disclosure can minimize filter latency by ensuring all core filter coefficients are stored in a dedicated register structure at one time and provide for shift register structures that reduce fanout from the volatile memory where they are programmed by a user.

It will be appreciated that the disclosure can be applied in many different contexts. One particular implementation example is that of an adaptive noise cancellation (ANC) system using sigma-delta infinite impulse response filters. In this context the present disclosure minimizes latency and hardware implementation area by requiring only one filtering circuit for multiple channels of data to be filtered, such as the four of feedforward and feedback channels for left and right ears in a headphone set using an ANC system. The optional features of the disclosure can provide for the number of channels to be increased while minimizing the implementation area, power consumption and latency.

The same advantages can also be provided for when it comes to implementing a plurality of filter orders either instead of or in addition to implementation of multiple channels using the same filter structure.

The disclosure is not limited to any particular device, but as an example, FIG. 10 is a schematic of a headphone apparatus which may be provided according to the present disclosure.

The apparatus 1000 comprises a left headphone cup 1010, a right headphone cup 1020 and a processing unit 1030. The apparatus 1000 further comprises: a left feedforward microphone 1012 placed externally to the left headphone cup 1010, a left feedback microphone 1014 and a left speaker 1016 placed internally to the left headphone cup 1010, a right feedforward microphone 1022 placed externally to the right headphone cup 1020, a right feedback microphone 1024 and a right speaker 1026 placed internally to the right headphone cup 1020. The processing unit 1030 comprises a DSP 400 which includes a filter structure 300 according to the disclosure, and optionally comprises other processing circuitry.

The microphones, the speakers and the processing unit 1030 implement a so-called active noise cancellation system (ANC). Active noise cancellation systems aim to reduce the environmental noise 1040 experienced by users of the headphone apparatus 1000 by superimposing an anti-noise signal generated by the processing unit 1030 to the audio signal that is being reproduced by the headphone apparatus 1000.

In operation, the feedforward microphones 1012 and 1022 detect the environmental noise signal 1040. The output of the microphones 1012 and 1022 is sent to the processing unit 1030 to be inverted and generate a feedforward anti-noise signal. The feedback microphones 1014 and 1024 detect the audio signal inside the headphone cups, at the user's ears. The output of the microphones 1014 and 1024 is sent to the processing unit 1030 and compared to the original audio signal and the difference used to create a feedback anti-noise signal. The anti-noise signal is a combination of the feedback and feedforward anti-noise signals and is mixed to the original audio signal to achieve noise cancellation.

Complex signal processing of the anti-noise signals is generally necessary in order to achieve optimal noise suppression at the user's ears, since the noise signal perceived at the user's ear, the noise signal detected by the feedforward microphones and the noise signal detected by the feedback microphones all travel along different acoustic paths. For example, the ANC might have to account for attenuation and phase shift experienced by the environmental noise signal when travelling through the headphone cups and/or for noise introduced in the anti-noise signal by the electrical components of the processing unit itself, such as quantization noise.

In some embodiments, the microphone 1012, 1014, 1022 and 1024 are digital microphones and their output signal is pulse density modulated.

In standard digital systems operating with digital microphones, filtering of the microphones' output signal requires to first convert the signal into pulse code modulation (PCM), then filter and finally convert back to pulse density modulation (PDM). However, this approach generally increases the latency of the system because decimation and interpolation must be performed in order to pass from PDM to PCM.

By using filters that operate directly on the oversampled PDM output of the digital microphones it is possible to reduce the latency of the system and minimize the hardware area, since there is no longer need of large decimator and interpolator blocks.

It will be appreciated that even though in the drawing the processing unit 1030 is displayed as a single block outside the headphone cups, in different embodiments the processing unit may consist of one or more physical blocks that may or may not be embedded in the headphone cups.

Various improvements and modifications may be made to the above without departing from the scope of the disclosure.

What is claimed is:

1. A digital filter structure arranged to receive one or more clocked input signals having a first clock rate, and which is driven at a second clock rate higher than said first clock rate;
    said digital filter structure comprising a plurality of delay elements and multiplexing circuitry arranged to selectively engage the delay elements such that, at every clock cycle of said digital filter structure, a filter operation is performed on a different stream of data; and
    the multiplexing circuitry comprising a demultiplexer and a multiplexer, wherein the demultiplexer and the multiplexer are coupled to the plurality of delay elements; and wherein the demultiplexer, the multiplexer and the plurality of delay elements are provided on a feedback loop;
    the digital filter structure further comprising a coefficient multiplexer arranged to select between a plurality of filter coefficients.

2. The digital filter structure of claim 1, further comprising an input multiplexer arranged to select between a plurality of input data channels.

3. The digital filter structure of claim 1, wherein the coefficient multiplexer comprises a feedforward coefficient multiplexer arranged to select between a plurality of feedforward filter coefficients and a feedback coefficient multiplexer arranged to select between a plurality of feedback filter coefficients.

4. The digital filter structure of claim 1, wherein said digital filter structure implements a linear time-invariant infinite impulse response digital filter.

5. The digital filter structure of claim 1, wherein the received clocked input signals comprise pulse density modulated signals.

6. The digital filter structure of claim 1, comprising a first memory for storing filter coefficients, a second memory structure comprising one or more registers and a coefficient loader arranged to fetch coefficients from said first memory and load them into said registers for use by the digital filter structure.

7. The digital filter structure of claim 6, wherein the second memory structure comprises a bank of memory registers coupled in series in a shift register arrangement.

8. The digital filter structure of claim 7, wherein the second memory structure comprises a plurality of register banks which operate in parallel.

9. An audio signal processing structure arranged to receive one or more clocked input signals having a first clock rate, and which is driven at a second clock rate higher than said first clock rate;
    said audio signal processing structure comprising a plurality of delay elements and multiplexing circuitry arranged to selectively engage the delay elements such that, at every clock cycle of said audio signal processing structure, a filter operation is performed on a different stream of data; and the multiplexing circuitry comprising a demultiplexer and a multiplexer, wherein the demultiplexer and the multiplexer are coupled to the plurality of delay elements; and wherein the demultiplexer, the multiplexer and the plurality of delay elements are provided on a feedback loop;
    the audio signal processing structure further comprising a coefficient multiplexer arranged to select between a plurality of filter coefficients.

10. Headphones comprising an audio signal processing structure, wherein the audio signal processing structure is arranged to receive one or more clocked input signals having a first clock rate, and which is driven at a second clock rate higher than said first clock rate;
    said audio signal processing structure comprising a plurality of delay elements and multiplexing circuitry arranged to selectively engage the delay elements such that, at every clock cycle of said audio signal processing structure, a filter operation is performed on a different stream of data; and the multiplexing circuitry comprising a demultiplexer and a multiplexer, wherein the demultiplexer and the multiplexer are coupled to the plurality of delay elements; and wherein the demultiplexer, the multiplexer and the plurality of delay elements are provided on a feedback loop;
    the audio signal processing structure further comprising a coefficient multiplexer arranged to select between a plurality of filter coefficients.

11. The headphones of claim 10, wherein the audio signal processing structure is provided as part of an adaptive noise cancellation device.

12. A method of digital filtering comprising:
    providing a digital filter structure arranged to receive one or more clocked input signals having a first clock rate, and which is driven at a second clock rate higher than said first clock rate;
    said digital filter structure comprising a plurality of delay elements and multiplexing circuitry arranged to selectively engage the delay elements such that, at every clock cycle of said digital filter structure, a filter operation is performed on a different stream of data; and
    the multiplexing circuitry comprising a demultiplexer and a multiplexer, wherein the demultiplexer and the multiplexer are coupled to the plurality of delay elements; and wherein the demultiplexer, the multiplexer and the plurality of delay elements are provided on a feedback loops,
    the digital filter structure further comprising a coefficient multiplexer arranged to select between a plurality of filter coefficients.

* * * * *